US006466018B1

(12) United States Patent
Dumoulin et al.

(10) Patent No.: US 6,466,018 B1
(45) Date of Patent: Oct. 15, 2002

(54) ROTATING BODY COIL APPARATUS FOR INTERVENTIONAL MAGNETIC RESONANCE IMAGING

(75) Inventors: Charles Lucian Dumoulin, Ballston Lake, NY (US); Philip Trefor Jones, London (GB); William Alan Edelstein, Schenectady, NY (US); Benjamin Assif, Ramat-Hasharon (IL); Nissim Ben Hamo, Kiryat Bialik (IL); David Keren, Kiryat-Yam (IL)

(73) Assignees: General Electric Company, Niskayuna, NY (US); Imperial College of Science and Medicine, London (GB)

( * ) Notice: Subject to any disclaimer, the term of this patent is extended or adjusted under 35 U.S.C. 154(b) by 0 days.

(21) Appl. No.: 09/541,544

(22) Filed: Apr. 3, 2000

(51) Int. Cl.⁷ .................................................. G01V 3/00
(52) U.S. Cl. .................................................... 324/318
(58) Field of Search .......................... 324/318; 329/318, 329/307, 309, 320, 322, 319

(56) References Cited

U.S. PATENT DOCUMENTS

| 4,692,705 A | 9/1987 | Hayes ........................ 324/318 |
| 4,887,039 A | 12/1989 | Roemer et al. ............. 324/322 |
| 5,153,546 A | * 10/1992 | Laskaris ...................... 335/216 |
| 5,600,245 A | * 2/1997 | Yamamoto et al. ......... 324/318 |
| 5,696,449 A | 12/1997 | Boskamp ..................... 324/318 |
| 5,999,839 A | 12/1999 | Hardy et al. ................. 600/413 |
| 6,043,658 A | * 3/2000 | Leussier ...................... 324/318 |

* cited by examiner

Primary Examiner—Edward Lefkowitz
Assistant Examiner—Dixomara Vargas
(74) Attorney, Agent, or Firm—Jean K. Testa; Donald S. Ingraham

(57) ABSTRACT

A rotating body coil assembly for use with an open MR magnet for imaging at least a portion of a subject comprises a resonant structure configured to rotate about the subject and to permit access to the subject during imaging. The body coil assembly comprises first and second end ring assemblies positioned on opposing sides of the imaging space. The first and second end ring assemblies are each configured to energize the body coil assembly. A plurality of element assemblies are disposed between and connecting the first and second end ring assemblies for providing structural support and electrical isolation of the body coil assembly. A base assembly is coupled to the first and second end ring assemblies and at least one of the element assemblies. The base assembly is adapted to rotate the first and second end ring assemblies in cooperation with the plurality of element assemblies about the portion of the subject while the portion of the subject is inside the imaging space for permitting access to the subject during imaging.

16 Claims, 8 Drawing Sheets

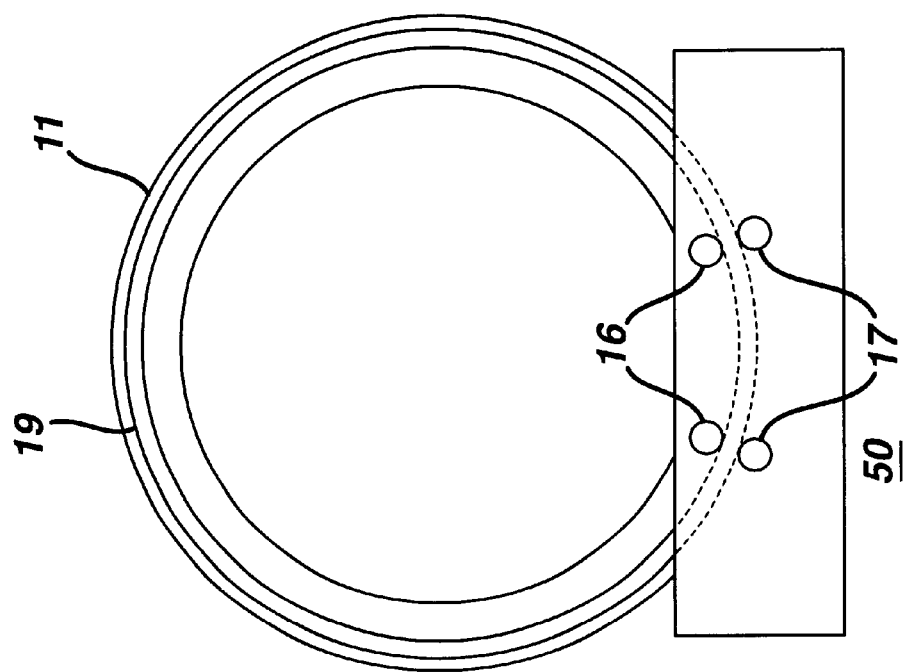
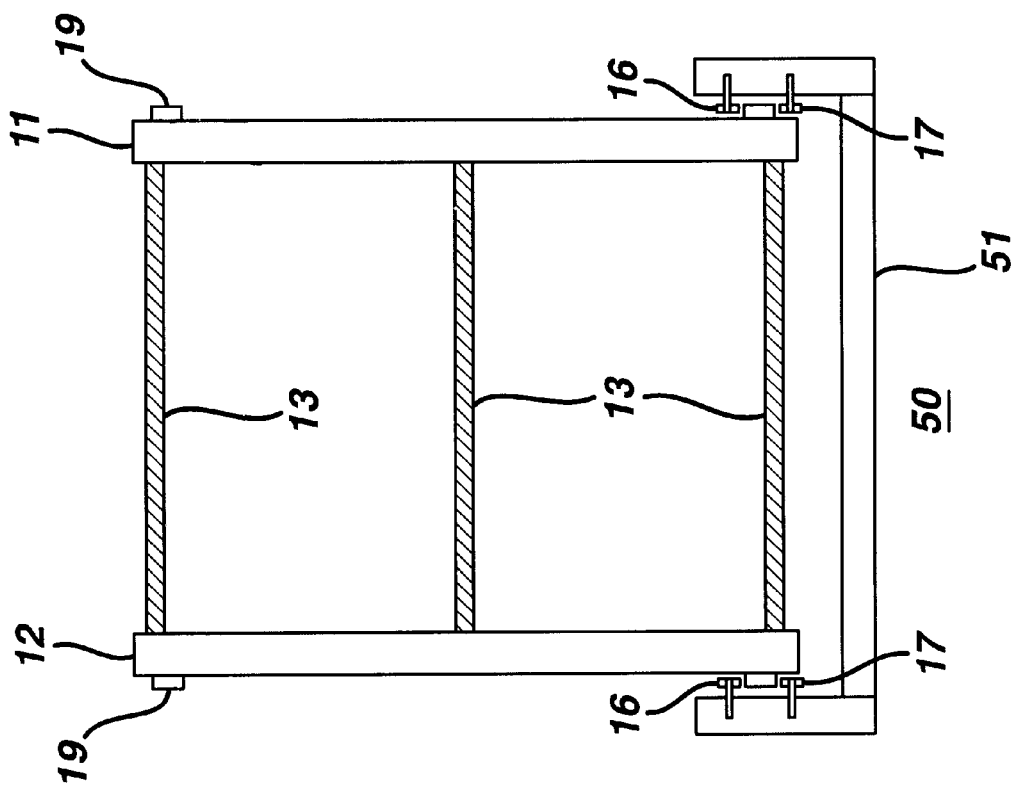

ROTATING BODY COIL APPARATUS FOR INTERVENTIONAL MAGNETIC RESONANCE IMAGING

BACKGROUND OF THE INVENTION

The present invention relates generally to an body coil system for use with an open magnetic resonance (MR) magnet, that is, a magnet which generates a main magnetic field for MR imaging in a space which is accessible to a patient or other imaging subject, and is not enclosed within a magnet bore. More particularly, the invention pertains to a body coil system for use in connection with an open MR system.

Open MR imaging represents an innovation in the field of MR imaging. The configuration of an open MR system generally comprises magnet components that are positioned on opposite sides of an imaging space. One particularly useful design comprises two donut-shaped ring magnets. The two ring magnets are energized to provide a resultant field in the imaging space which comprises the static magnetic field for MR imaging. This configuration enables the positioning of an imaging subject more conveniently and more comfortably than the closed magnetic bore configuration. Specifically, the subject can enter the imaging space either by passing through the center of one of the ring magnets or can enter directly into the space between them. Also, the open magnet arrangement enables attendant physicians access to the subject to treat and closely monitor a subject while MR imaging is in progress.

If an interventional procedure is to be performed while a patient is in an MR imaging system, it is essential that the clinician have adequate access to the patient during the procedure. Also, the image quality must be sufficiently high enough to assist the clinician during an interventional procedure while imaging.

To allow access to the patient, current interventional MR imaging systems such as the GE SIGNA™ SP employ flexible coils including an opening to provide access to the region being imaged and for both transmit and receive functions. While these coils provide adequate access to the patients, acquiring the image quality needed for use during interventional procedures is challenging due to inconsistent behavior and variable geometry of such coils. Examples of challenges include non-uniform images with reduced signal to noise in the region of interest.

In conventional MR scanners high image quality is frequently obtained by employing a large transmit coil for the creation of the MR signal and smaller surface coils for the detection of the MR signal. This combination provides optimal signal-to-noise ratios, particularly when the surface coil is a multi-coil array. Unfortunately, it has not been possible to use such a coil combination in interventional procedures because current body coil designs employ structures such as inductive elements and rf shields which prevent adequate access to the patient.

Thus, there is a need for an imaging coil system that provides both high image quality while at the same time providing access to the patient.

BRIEF SUMMARY OF THE INVENTION

A rotating body coil assembly for use with an open MR magnet for imaging at least a portion of a subject comprises a resonant structure configured to rotate about the subject and to permit access to the subject during imaging.

A rotating body coil assembly for use with an open MR magnet that comprises a pair of main magnet components positioned on opposing sides of an imaging space disposed to receive at least a portion of a subject for imaging. The body coil assembly comprises first and second end ring assemblies positioned on opposing sides of the imaging space. The first and second end ring assemblies are each configured to energize the body coil assembly. A plurality of element assemblies are disposed between and connecting the first and second end ring assemblies for providing structural support and electrical isolation of the body coil assembly. A base assembly is coupled to the first and second end ring assemblies and at least one of the element assemblies. The base assembly is adapted to rotate the first and second end ring assemblies in cooperation with the plurality of element assemblies about the portion of the subject while the portion of the subject is inside the imaging space for permitting access to the subject during imaging.

BRIEF DESCRIPTION OF THE DRAWINGS

The features and advantages of the present invention will become apparent from the following description of the invention when read with the accompanying drawings in which:

FIGS. 11 and 12 illustrate views of a rotating body coil assembly with an alternate embodiment of a base assembly such as that of FIG. 10;

DETAILED DESCRIPTION OF THE INVENTION

Figure 1:
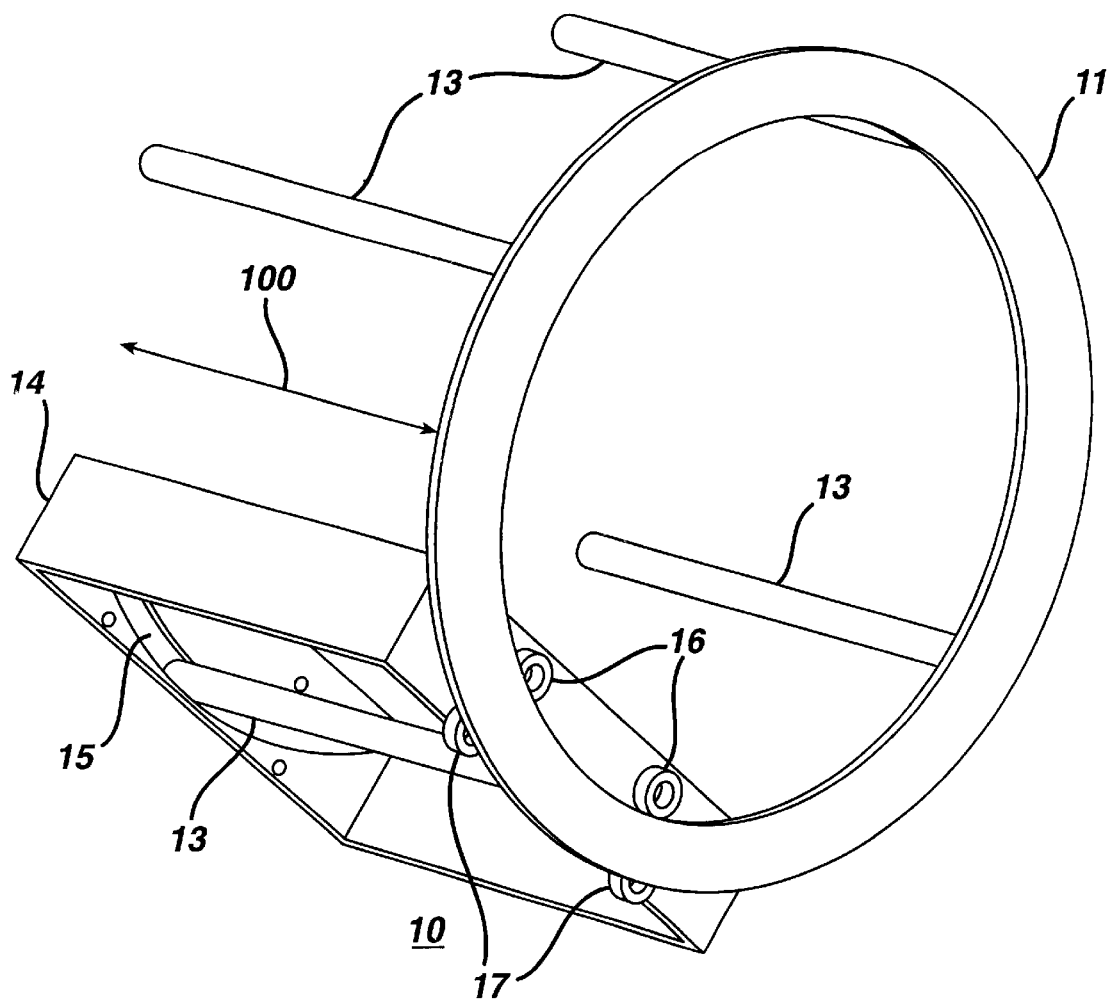
FIG. 1 illustrates one exemplary rotating body coil assembly in accordance with a preferred embodiment of the present invention.
Figure 15:
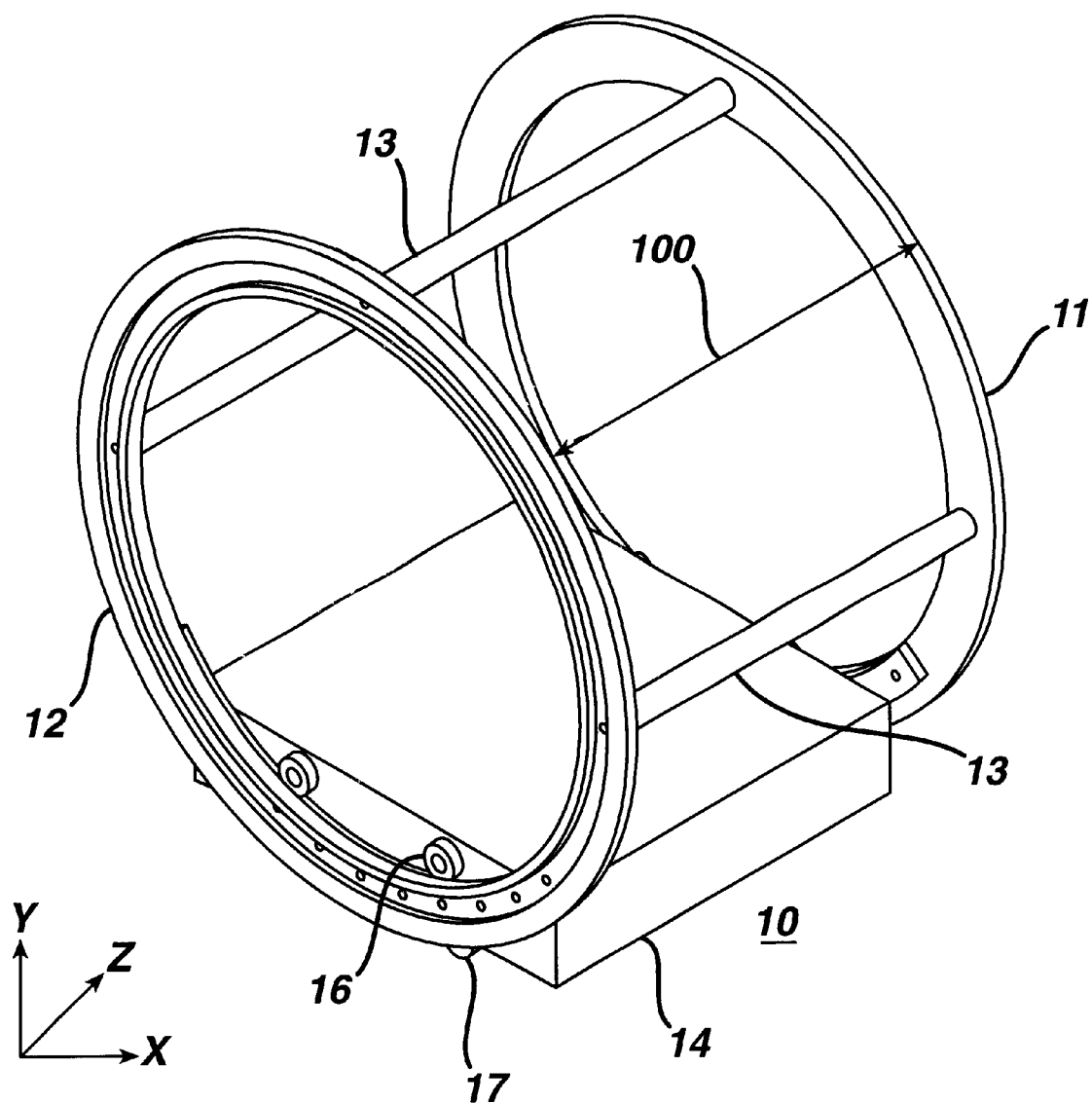

FIG. 1 illustrates an exemplary rotating body coil assembly 10 to which preferred embodiments of the present invention are applicable for use in an open MR magnet, such as the GE SIGNA™ SP magnet. Coil assembly 10 generally comprises a first end ring assembly 11 and a second end ring assembly 12 (not shown in view illustrated in FIG. 1), which are spaced apart from one another along an axis, such as the Z-axis, of the open magnet system. FIG. 15 illustrates body coil assembly 10 including end ring assemblies 11 and 12. End ring assemblies 11 and 12 oppose one another about an imaging space 100. Referring again to FIG. 1, end ring assemblies 11 and 12 (not shown) are preferably circular, for example, ring-shaped and substantially the same size as the magnet bore (for example, in a preferred embodiment, the inner diameter of end rings 11 and 12 is 60 cm). The ring-shaped configuration is particularly well-adapted for rotation, but it is appreciated that other configurations adaptable for rotation, such as an oval or an arc or the like, may be used. The imaging space is sufficiently large enough to accommodate a subject or a portion of a subject for imaging within. The inner diameter of end ring assemblies 11 and 12 is large enough to permit a patient bed (not shown) to be rolled through the coil and to permit patients to be moved while in the coil. In one embodiment, each of end ring assemblies 11 and 12 comprise capacitors, as is known in conventional high-pass bird cage coil configurations, or in another embodiment, end ring assemblies 11 and 12 comprise inductive elements, as is known in conventional low-pass bird cage coil configurations.

End ring assemblies 11 and 12 are joined together by a number of element assemblies 13 disposed between and connecting end ring assemblies 11 and 12. Referring further to FIG. 1, body coil assembly 10 comprises 4 element assemblies in a quadrature configuration, i.e. equally spaced about the circumference of end ring assemblies 11 and 12. Each element assembly 13 is an inductor. Each element assembly is comprised of a material providing structural support, for example a solid copper rod of ⅜ inch diameter, and further comprises a material for electrical isolation, for example, encasing the rod in a Plexiglass™ tube of 1 inch diameter. The spacing or opening between the elements is preferably large enough to permit access to the patient, suitable for use in many interventional procedures.

First and second end ring assemblies 11 and 12, respectively, and element assemblies 13 form a resonant structure, also known as a MR imaging coil. The resonant structure can operate as a transmit or receive coil in the MR system. The resonant structure can be supplied with RF energy for the purpose of nutating longitudinal MR magnetization into the transverse plane. Alternatively, the resonant structure can be used to detect the MR signal which can then be used to reconstruct an image of an area of interest within the subject, in a manner well known to those skilled in the art. Embodiments in which the resonant structure acts as a transmit/receive, transmit-only and receive-only coil are possible.

Referring further to FIG. 1, body coil assembly 10 further comprises base assembly 14 and base aperture 15. Base assembly 14 supports the sub-assembly comprising end ring assemblies 11 and 12 and elements 13 on a set of rollers or bearings that permit the coil to be rotated about its axis of symmetry, such as the center of imaging space 100. Inner bearing assemblies 16 and outer bearing assemblies 17 support end ring assemblies 11 and 12 and allow the end ring assemblies to move or rotate. Inner bearing assemblies 16 and outer bearing assemblies 17 are affixed on base assembly 14, for example by shafts (not shown), to hold end ring assemblies 11 and 12 in place on base assembly 14 and to permit rotation. Preferably, at least one inner bearing assembly 16 and two outer bearing assemblies 17 are needed to provide stability. FIG. 1 shows two inner bearing and outer bearing assemblies, for purposes of illustration. Both inner bearing assemblies 16 and outer bearing assemblies 17 are made of plastic, or similar non-metallic and non-conducting material. Base aperture 15 is configured to receive one of element assemblies 13 in order to couple the end-ring and element sub-assembly to base assembly 14, and base aperture 15 also serves as a path for rotation of body coil assembly 10. As used herein, "adapted to", "configured" and the like refer to mechanical or structural connections between elements, and also refer to operation capabilities of electrical elements described herein.

Figure 8:
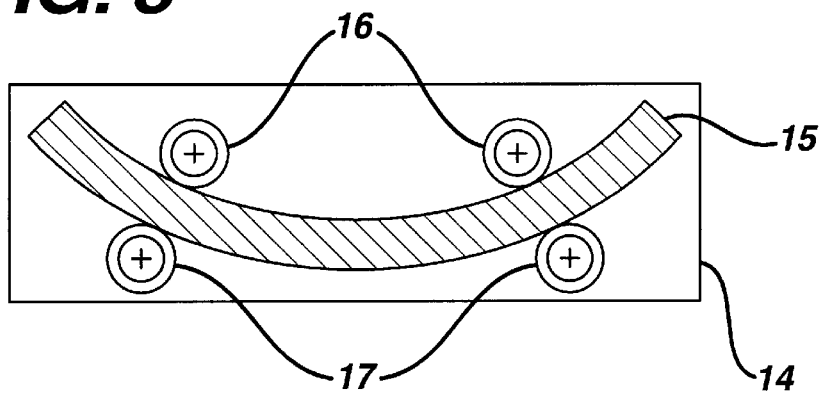
FIG. 8 illustrates one embodiment of base assembly useful in rotating body coil assembly of FIG. 1.

Referring to FIG. 8, there is shown an end view of base assembly 14 comprising base aperture 15, inner bearing assemblies 16 and outer bearing assemblies 17. In a preferred embodiment, base aperture 15 comprises an opening in base assembly 14 that is an arc of about 70 degrees for receiving one of four element assemblies 13. It can be appreciated that the degree of rotation that is possible depends on the number of element assemblies 13. For example, it is estimated that an embodiment with six element assemblies 13 would have a base aperture comprising an opening that is a 40 degree arc, and an embodiment with eight element assemblies 13 would have a base aperture comprising an opening that is a 35 degree arc.

Figure 2:
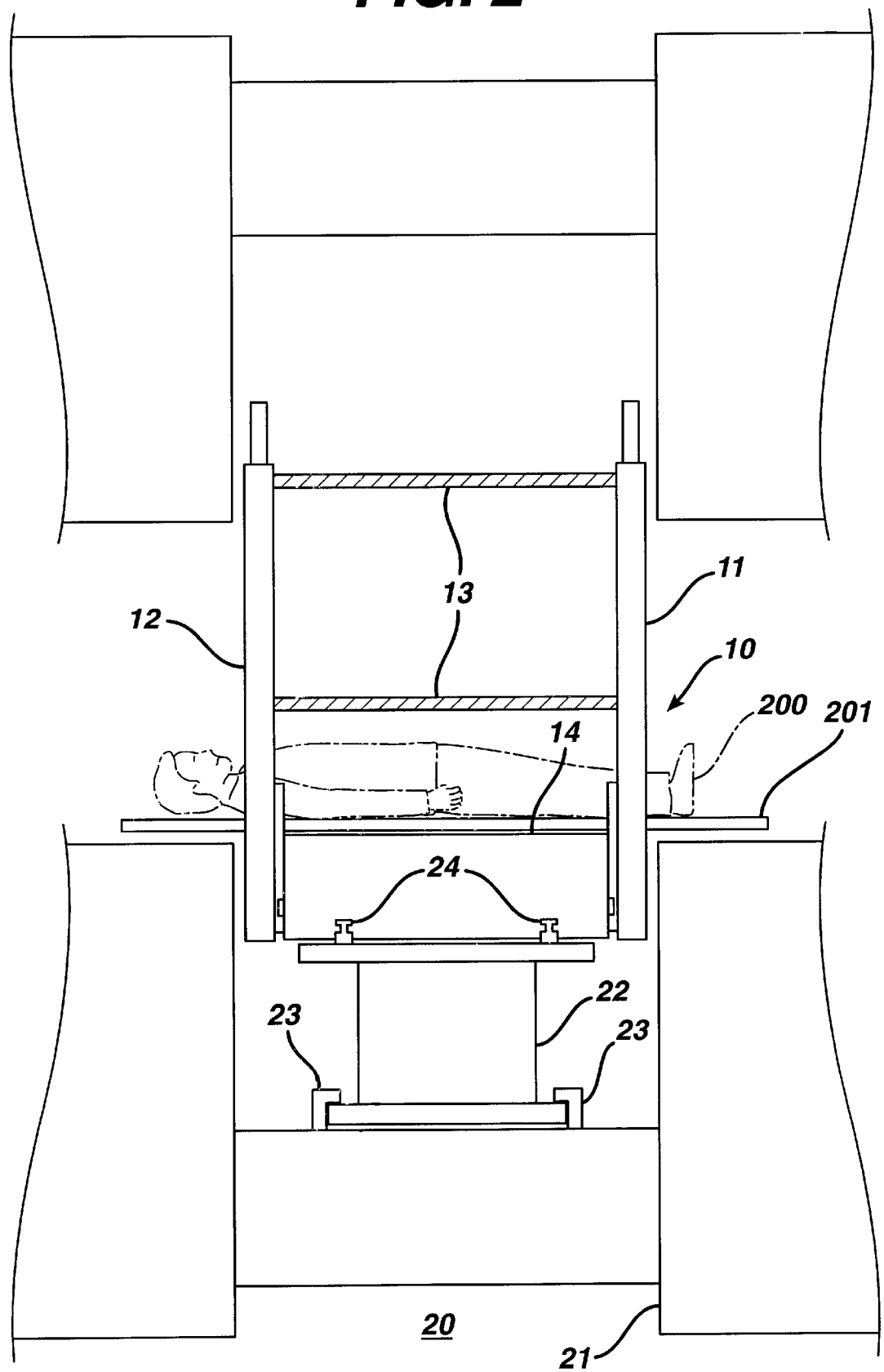
FIG. 2 is an illustration of an open MR magnet system to which preferred embodiments of the present invention are applicable.

Referring to FIG. 2, there is shown Magnetic Resonance (MR) system magnet assembly 20 including body coil assembly 10 in place. Double ring magnet 21, such as the GE SIGNA™ SP magnet, is an open MR magnet. Alignment posts 24 couple base assembly 14 to pedestal 22, which is coupled to pedestal coupling 23. Pedestal coupling 23 couples to magnet 21, and secures body coil assembly 10 and pedestal 22 to magnet 21. Subject 200 enters body coil assembly 10 on patient table 201, shown passing through the inner diameter of end ring assemblies 11 and 12.

Figure 3:
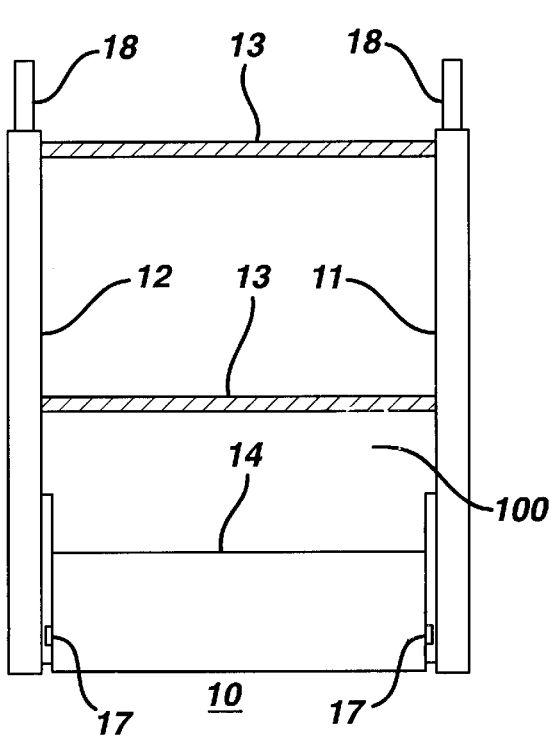
FIGS. 3–5 are views of a rotating body coil such as that represented in FIG. 1.
Figure 5:
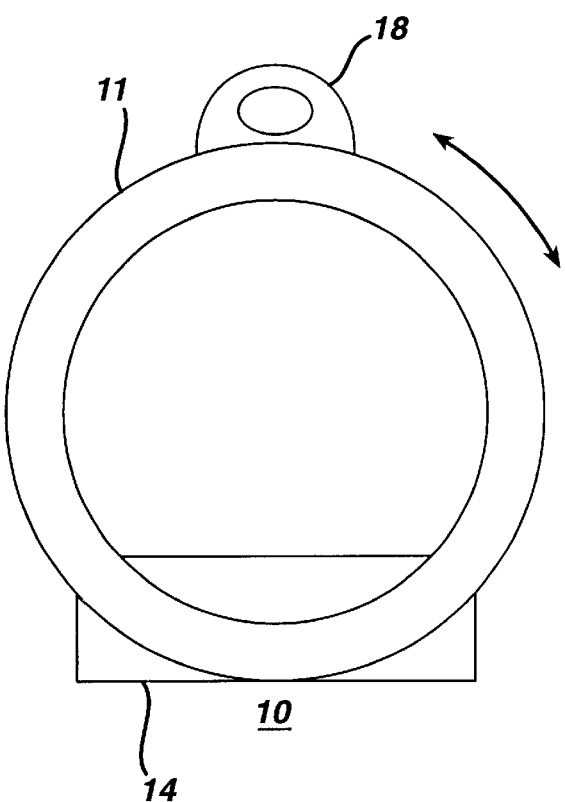
Figure 4:
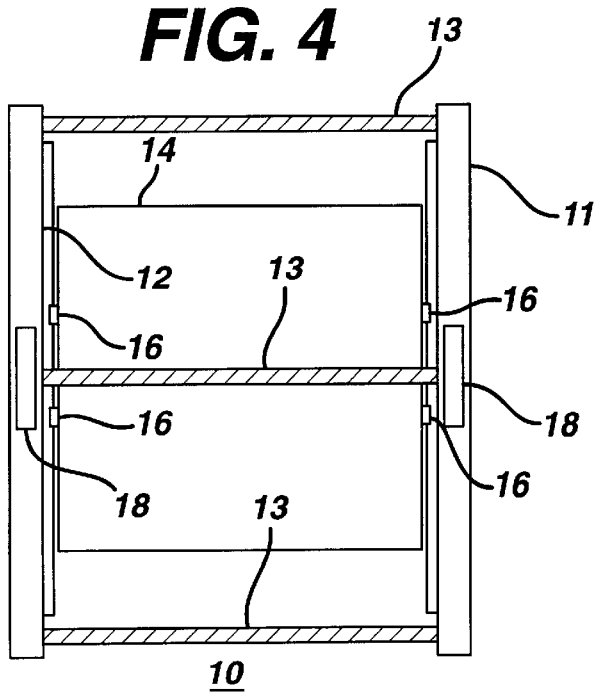

Referring to FIG. 3, there is shown a side view of body coil assembly 10. End ring handles 18 are shown at the top of end ring assemblies 11 and 12, and are for carrying body coil assembly 10 outside of magnet 21 (not shown) or for rotating body coil assembly 10. End ring handles 18 permit convenient installation and removal of the body coil. For ease of installation, side handles (not shown) attached to base assembly 14 can also be used. Referring to FIG. 5, there is shown an end view of body coil assembly 10 showing end ring handle 18. Referring to FIG. 4, there is shown a top view of body coil assembly 10.

Figure 6:
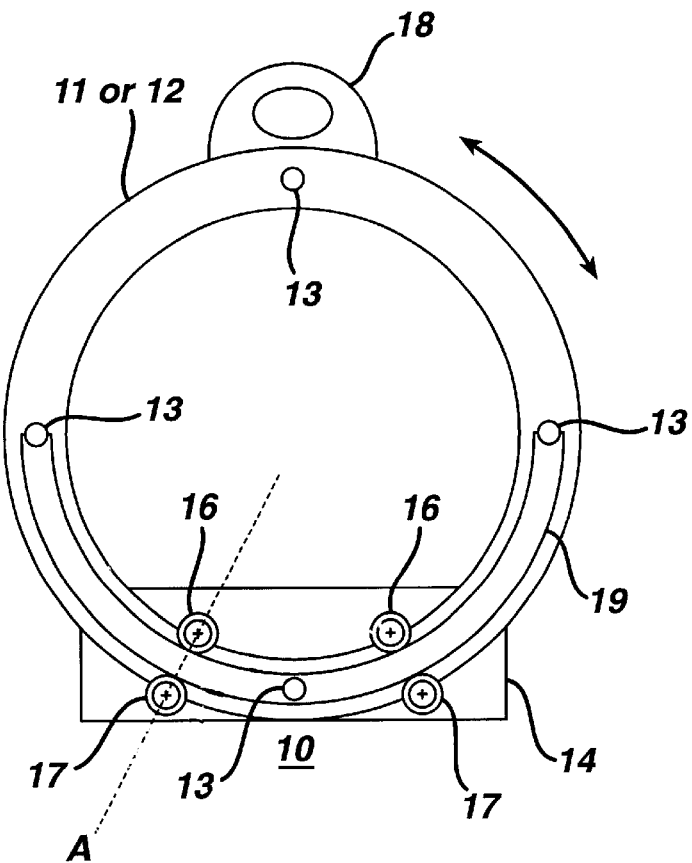
FIG. 6 illustrates one embodiment of an end ring assembly useful in rotating body coil assembly of FIG. 1.
Figure 7:
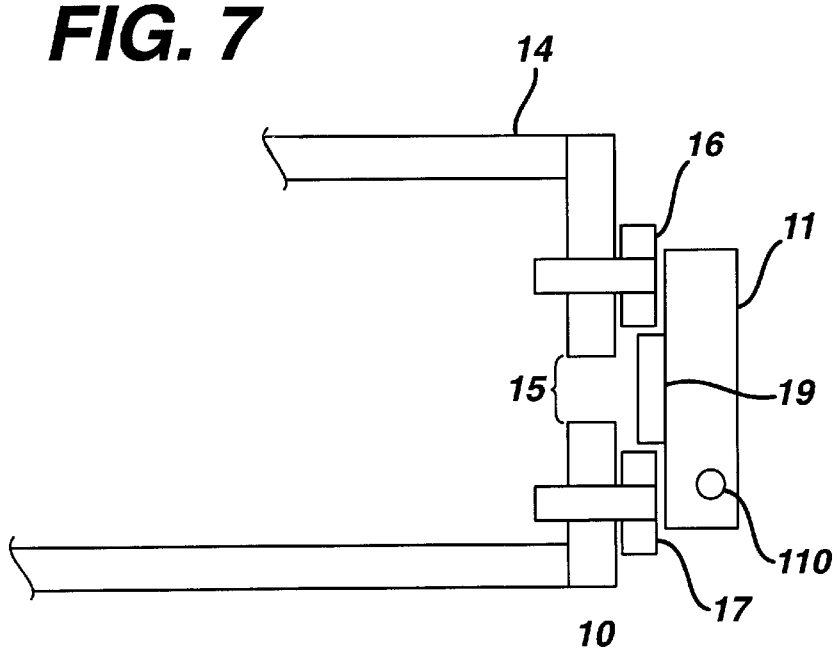
FIG. 7 illustrates an cross-section view of rotating body coil assembly showing end ring assembly such as that represented in FIG. 6.

FIG. 6 is an illustration of an end view of body coil assembly 10 showing details as described with reference to FIGS. 1–5, and further comprising guide rails 19 (one shown). Guide rails 19 are coupled to the respective sides of end ring assemblies 11 and 12 that face the imaging space 100. Guide rails 19 provide structural support for end ring assemblies 11 and 12, and also enable body coil assembly 10 to be rotated. Guide rail 19 is shaped to correspond to at least a portion of end ring assemblies 11 and 12, for example an arc or semi-circle in a preferred embodiment. Guide rail 19 is made of material that is electrically non-conducting, such as polycarbonate, teflon or polyethelyene. Inner bearing assemblies 16 and outer bearing assemblies 17 hold guide rail 19 in place, and allow movement or rotation along the path created by base aperture 15 (not shown) in base assembly 14. FIG. 7 is a cross section view of body coil assembly 10 along section A shown in FIG. 6 showing placement of guide rail 19 relative to end ring assembly 11 and base aperture 15, and further comprising end ring conductor 110.

Body coil assembly 10 is preferably constructed of non-conducting, non-ferrous materials such as fiberglass or polycarbonate. Body coil assembly 10 can be hermetically sealed to accommodate spilled liquids. All surfaces can be been painted with a high-gloss enamel paint.

Because of the need for patient access and the geometry of the surrounding conducting surfaces, the body coil does not employ an RF shield. A conventional RF shield would prevent interactions between body coil assembly and the surrounding magnet, as well as interfering with access to the patient. The absence of a shield is possible in the open magnet because there are few conducting structures near the coil. Nevertheless, designs in which rf shields are incorporated into the coil are possible. If used, these rf shields will need to have openings to provide access to the patient. Another embodiment of the invention comprises the incorporation of an open rf shield.

Thus, another embodiment of the invention comprises a self-shielded coil. A self-shielded coil has, in addition to the main coil structure, a second coil structure which is magnetically coupled to the main coil. This second coil structure is configured to create magnetic fields which cancel the external magnetic field of the main coil and thereby reduce the influence of the magnet, gradient coils and surgeon or clinician on the sensitivity of the main coil. This additional structure can be shaped similar to the main coil structure in order to permit access to the patient. Advantageously, this embodiment reduces coupling and loading of MR coils from all of their surroundings, thereby maintaining high coil sensitivity.

Figure 9:
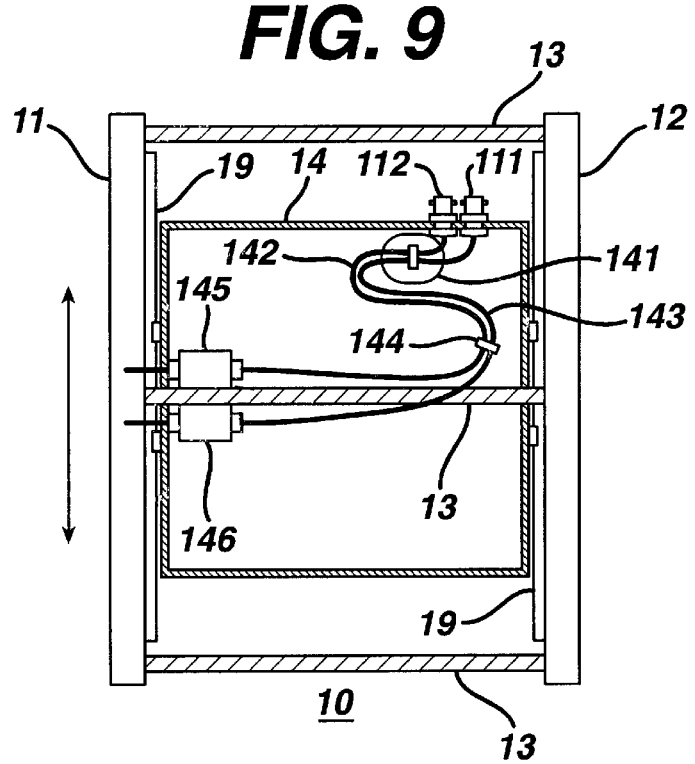
FIG. 9 illustrates a bottom view of rotating body coil assembly.

FIG. 9 illustrates a bottom view of rotating body coil assembly 10 further comprising electrical components. First and second connectors 111 and 112, respectively, to MR systems RF electronics are provided in a conventional manner. Cable tie down 141 and cable tie down 144 secure first and second co-axial internal cables 142 and 143, respectively, to base assembly 14. The electrical components are operable for driving the MR system, in a manner known to those well skilled in the art. RF energy is provided to the resonant structure comprising first and second end ring assemblies 11 and 12, respectively, and elements 13. The RF energy is used to excite spins in the subject and to generate MR magnetization to generate MR signals which can be detected and used to reconstruct an image. The lengths of cables 142 and 143 are sufficient to permit rotation of body coil assembly 10, as described with reference to FIGS. 1–8.

First balun 145 and second balun 146, also known as balanced-to-unbalanced transformers, are used in a conventional manner for connection and isolation to co-axial cables 142 and 143. The baluns are tuned to the resonant frequency of the MR imaging system and act as a common-mode trap. Thus, RF energy flowing simultaneously along the shield and inner-conductor of the co-axial cables 142 and 143 will experience a high impedance and will be attenuated. RF energy flowing in a differential fashion such as the detected MR signal, however, will not be attenuated. The use of baluns inserted in series with the drive cables raises the impedance of undesired electrical loops created by the co-axial cables. Since these loops have a high impedance, their interactions with the resonant structure of the body coil are minimized.

Tuning the rotating body coil is perform ed in a similar manner as tuning a birdcage coil, which is well known to those skilled in the art. The first step in tuning a birdcage coil is typically an estimation of the values of the capacitors required to make the coil resonate at the desired frequency. This can be done using a computer simulation. Alternatively, the coil can be built with equal-valued capacitors having an arbitrary capacitance, C. The resonance frequency, Omega, can then be determined experimentally with a network analyzer or similar piece of test equipment. Using the measured resonance frequency and the value chosen for the capacitors, the inductance of the coil, L, can be computed using the relationship:

Omega=1/(2*pi* sqrt(LC))

Once L is known, then it is straightforward to use the above equation for Omega to estimate the capacitance needed to resonate the coil at the desired frequency.

Once the capacitors of the birdcage coil have been selected to resonate the coil at the desired frequency, the magnetic field generated by the coil needs to be balanced. This can be done by evaluating the resonant frequency of the coil as a function of orientation using a pickup coil and a network analyzer. Typically, two orthogonal frequency components will be found. These two components can be brought together by adding or subtracting capacitance from the appropriate locations in the birdcage coil. If there is a coupling between the modes, however, changing the frequency of one mode will have an undesired effect on the other. It may not be possible to bring the two resonance mode s together, for example when coupling is severe, then capacitance (or inductance) can be added or subtracted at a location in the coil having equal contributions to the two modes. A mutual inductance can be canceled with a capacitor, and a mutual capacitance can be canceled with an inductor.

Once the birdcage coil resonates at the desired frequency and is balanced, the coil can then be attached to cables to connect it to the imaging system. Attachment to the imaging system typically requires the insertion of a matching capacitor so that the impedance of the coil is matched to that of the imaging system, thereby minimizing transmission losses. This impedance is frequently chosen to be 50 ohms.

Unlike simple loop coils, a birdcage coil has the ability to generate (and detect) a rotating or quadrature magnetic field. To drive a quadrature birdcage coil, the MR imaging system must be attached at two orthogonal points along the coil. RF energy is simultaneously applied to each attachment point, but the second attachment point is driven by a RF signal having a 90 degree phase shift with respect to the first attachment point. This causes the birdcage coil to generate a rotating magnetic field which efficiently interacts with the nuclear spin magnetization. The purity of the rotating field can be evaluated by reversing the phase relationship between the two attachment points. If the rotation of the magnetic field in the birdcage coil is perfect, the RF excitation will occur at the negative of the Larmor frequency and no MR signal will be generated or detected.

Construction of a four-element birdcage coil presents several challenges. For example, canceling out the mutual inductance between the orthogonal resonant modes is made difficult by the small number of capacitors. One solution to this problem is to construct the coil as a high-pass birdcage coil in which the tuning capacitors are not equidistant between the elements, but rather are situated close to each element. Balancing capacitors can then be added to selected points within the coil to compensate for mutual inductance. Alternatively, a low-pass or band-pass birdcage coil design can be employed.

The use of a large rotating body coil such as the on e described in the present invention provides both high image quality and patient access. Patient access is obtained by constructing the coil without an RF shield and minimizing the size of the physical components of the coil. Because the coil can be rotated, even during a MR scan, the large access window can be moved to any desired region of the subject. Dependence of tuning and matching of rotating body coil 10 with position can be minimized by selecting the axis of rotation to be coincident with the axis of symmetry of the magnet.

Advantageously, high image quality is obtained with the rotating body coil for several reasons. First, the rotating body coil is larger than the region of interest and creates a relatively uniform excitation field in the patient. Smaller RF coils will by necessity create less homogeneous RF fields. Increased homogeneity of the RF excitation field reduces image artifacts in spin-echo and multiple spin echo imaging procedures. Secondly, the rotating body coil is rigid and does not change its shape as it is moved about the subject. Consequently, the tuning and matching of the coil remain constant and robustly provide an optimal RF field. Flexible coils, on the other hand, have an indeterminate shape, and thus have different tuning and matching each time they are applied to the subject. A further advantage of the rotating body coil, however, is that it can be used in conjunction with smaller receive coils and/or surface coil arrays. Use of a dual-coil approach is well know to those skilled in the state of the art and it is widely recognized that combining the RF excitation homogeneity of a large body coil with the sensitivity of a small surface coil provides optimum signal-to-noise ratios and image uniformity.

Figure 10:
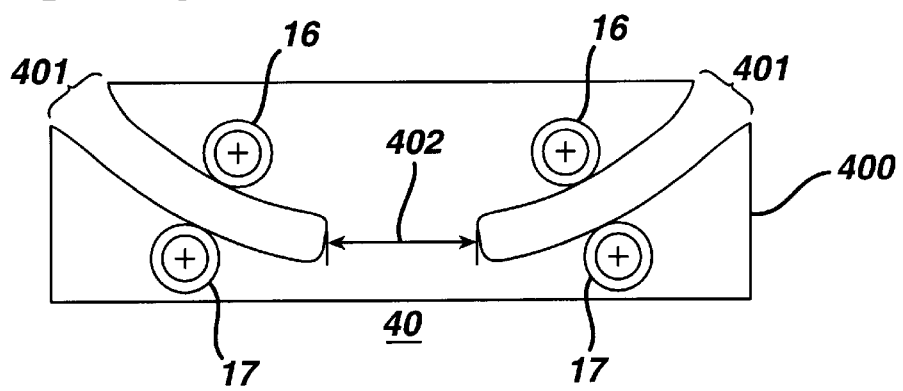
FIG. 10 illustrates another embodiment of a base assembly of the present invention.

FIG. 10 illustrates an alternate embodiment of base assembly 40, comprising an alternate aperture 401 and base 400 such that elements 13 (not shown) are received by apertures 401 to permit movement or rotation of body coil assembly 10. A gap 402 between apertures 401 is adaptable to permit varying degrees of rotation; for example, a substantially small or narrow gap 402 provides a wide degree rotation through apertures 401. It can be appreciated that a substantially small gap 402 could enable substantially full rotation of the body coil assembly through base assembly 40. Inner and outer bearing assemblies 16 and 17, respectively, operate to guide rotating body coil assembly as described with reference to FIG. 8.

FIGS. 11 and 12 show side and end views of another embodiment body coil assembly 50 in which full rotation of body coil assembly 50 is possible. Referring to FIG. 12, there is shown alternate base assembly 51. Base assembly 51 is constructed without sides and with end ring assemblies 11 and 12 coil supported by rollers located on the inside ends of the base. Guide rail 19 is shaped to correspond to the full circumference of end ring assemblies 11 and 12. Such a design will permit full rotation of the coil about its axis of symmetry since the elements will never encounter a structural member of the base. Co-axial cables 142 and 143 are connected directly to end ring assemblies 11 and 12. Alternatively, inductive coupling for driving such a body coil assembly are used to avoid the use of drive cables.

Figure 13:
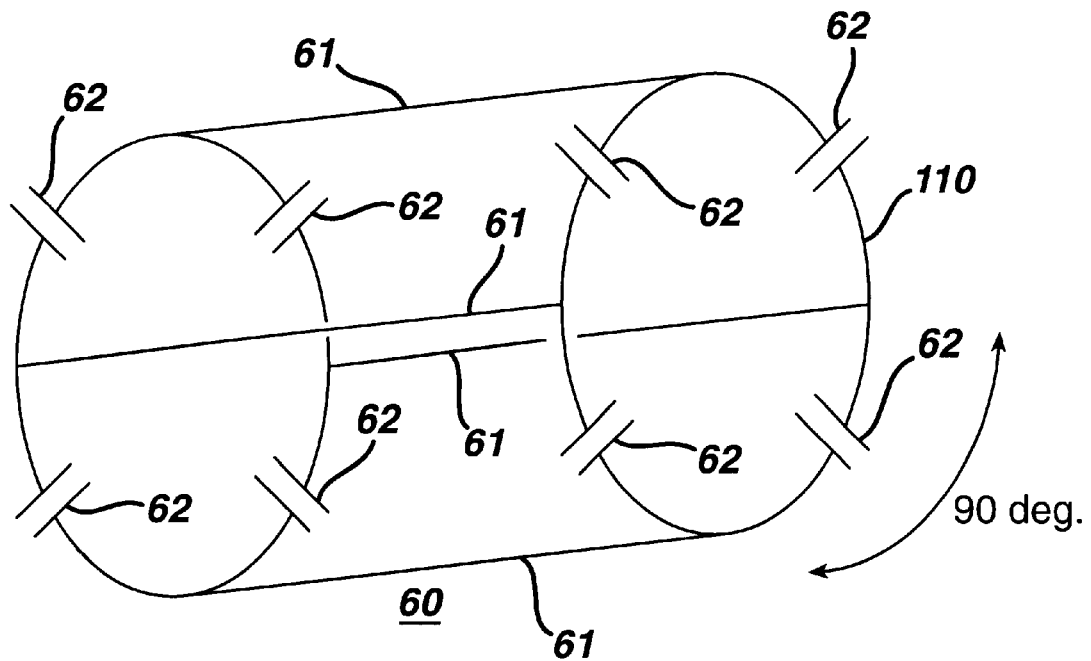
FIGS. 13 and 14 illustrate alternate embodiments of electrical configurations of a rotating body coil assembly; and, FIG. 15 illustrates a perspective view of an exemplary rotating body coil assembly in accordance with a preferred embodiment of the present invention.
Figure 14:
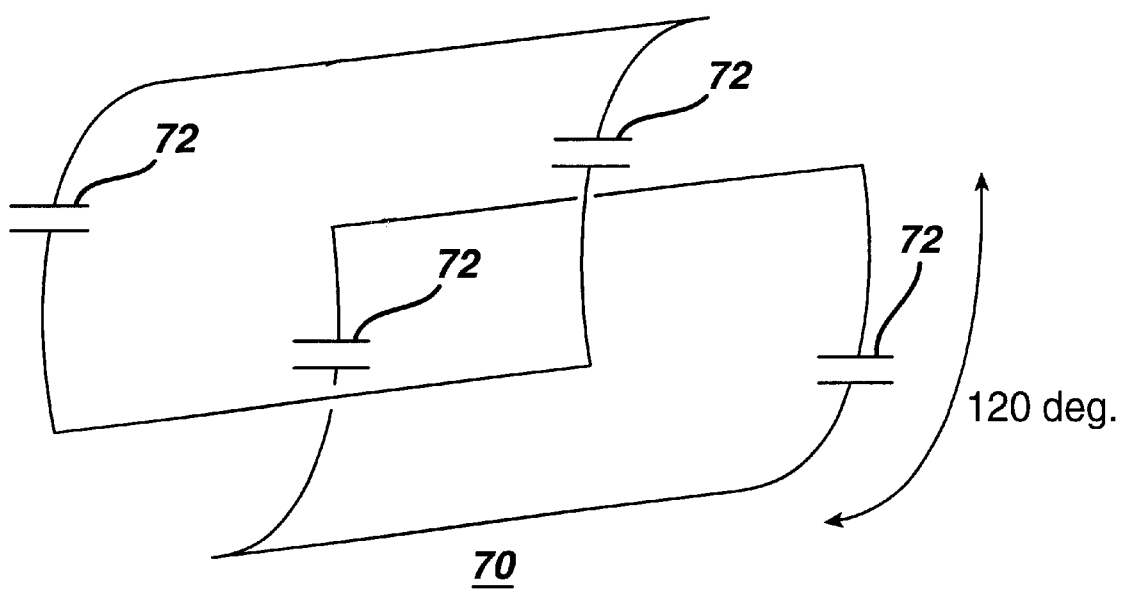

FIGS. 13 and 14 illustrate a further embodiments of electrical configurations of a body coil assembly. Referring to FIG. 13, there is shown a 4-element high-pass birdcage coil assembly 60, comprising inductive elements 61 and end ring capacitors 62. Inductive elements 61 are distributed at 90 degree intervals. Referring to FIG. 14, there is shown a body coil assembly comprising saddle coil 70 and saddle coil capacitors 72. With a saddle coil configuration, elements are distributed 120 degrees apart from one another which affords a larger opening between elements for access to the patient.

Designs in which the elements are removable are possible. While it is unlikely that a design in which elements can be removed during a scan will be practical, elements that can be removed between scans would be particularly useful to provide additional access to the patient. For example, it is possible to have a design in which an element can be removed to permit a patient to enter the birdcage coil in a sitting position with his/her legs, arms and torso exiting from different openings between the elements.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited by the spirit and scope of the appended claims.

What is claimed is:

1. A rotating body coil assembly for use with an open magnetic resonance (MR) magnet, said open MR magnet comprising a pair of main magnet components positioned on opposing sides of an imaging space configured to receive at least a portion of a subject for imaging, said body coil assembly comprising:

a MR imaging body coil disposed in the open MR magnet, said MR imaging body coil being responsive to RF energy for detecting MR signals for use in imaging said subject, said MR imaging body coil being adapted to rotate about an axis within said imaging space and permit access to said subject during imaging.

2. The rotating body coil assembly of claim 1 wherein said MR imaging body coil comprises:

first and second end ring assemblies positioned on opposing sides of said imaging space;

a plurality of element assemblies disposed between and connecting said first and second end ring assemblies, said element assemblies each providing structural support of said body coil assembly, said plurality of elements assemblies and said first and second end ring assemblies forming a resonant structure responsive to RF energy for imaging said subject.

3. A rotating body coil assembly for use with an open magnetic resonance (MR) magnet, said open MR magnet comprising a pair of main magnet components positioned on opposing sides of an imaging space configured to receive at least a portion of a subject for imaging, said body coil assembly comprising:

first and second end ring assemblies positioned on opposing sides of said imaging space;

a plurality of element assemblies disposed between and connecting said first and second end ring assemblies, said element assemblies each providing structural support and electrical isolation of said body coil assembly, said plurality of elements assemblies and said first and second end ring assemblies forming a MR imaging body coil responsive to RF energy for detecting MR signals for use in imaging said subject, said MR imaging body coil being configured to allow access to said subject during imaging; and, further adapted to rotate about said subject a base assembly coupled to said first and second end ring assemblies and at least one of said element assemblies, said base assembly being adapted to rotate said first and second end ring assemblies in cooperation with said plurality of element assemblies about the portion of said subject while the portion of said subject is inside said imaging space for permitting access to said subject during imaging.

4. The rotating body coil assembly of claim 3 wherein said first and second end ring assemblies are ring-shaped and substantially similar in size, and said first and second end ring assemblies comprise capacitive elements.

5. The rotating body coil assembly of claim 3 wherein the plurality of element assemblies each comprise an inductive rod encased in a non-conductive covering.

6. The rotating body coil assembly of claim 5 wherein said inductive rod is solid copper and said non-conductive covering is plastic tubing.

7. The rotating body coil assembly of claim 3 wherein a quantity of said plurality of element assemblies is selected to create a respective spacing between said element assemblies sufficient to allow interventional access to the portion of said subject while said subject remains in said imaging space.

8. The rotating body coil assembly of claim 3 wherein said base assembly comprises an aperture for receiving one of said element assemblies and wherein said aperture is for effecting said rotation.

9. The rotating body coil assembly of claim 3 wherein said base assembly further comprises inner and outer bearing assemblies for coupling said first and second end ring assemblies to said base assembly and to permit rotation thereof.

10. The rotating body coil assembly of claim 3 further comprising first and second end ring handles connected to said first and second end ring assemblies, respectively, said end ring handles for moving said body coil assembly within the open MR magnet.

11. The rotating body coil assembly of claim 3 further comprising guide rails coupled to said first and second end ring assemblies, said guide rails being disposed to provide support and to guide rotation of said body coil assembly.

12. The rotating body coil assembly of claim 3 wherein said base aperture permits substantially full rotation of said body coil assembly.

13. The rotating body coil assembly of claim 3 further comprising electronics configured to permit rotation of said body coil assembly.

14. The rotating body coil assembly of claim 3 wherein said first and second end ring assemblies and said plurality of elements form a birdcage coil configuration.

15. The rotating body coil assembly of claim 3 wherein said first and second end ring assemblies and said plurality of elements form a saddle coil configuration.

16. The rotating body coil assembly of claim 3 wherein at least one of said plurality of elements is removable from said body coil assembly to permit further access to said subject.

* * * * *